(12) United States Patent
Xian et al.

(10) Patent No.: US 10,535,683 B2
(45) Date of Patent: Jan. 14, 2020

(54) ARRAY SUBSTRATE AND DISPLAY DEVICE

(71) Applicant: BOE Technology Group Co., Ltd., Beijing (CN)

(72) Inventors: Jianbo Xian, Beijing (CN); Yongda Ma, Beijing (CN); Yong Qiao, Beijing (CN); Xinyin Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/003,416

(22) Filed: Jun. 8, 2018

(65) Prior Publication Data

US 2019/0057983 A1 Feb. 21, 2019

(30) Foreign Application Priority Data

Aug. 21, 2017 (CN) .......................... 2017 2 1047203

(51) Int. Cl.
  *H01L 27/12* (2006.01)
  *H01L 27/02* (2006.01)
  *G02F 1/1362* (2006.01)

(52) U.S. Cl.
  CPC .... *H01L 27/1244* (2013.01); *G02F 1/136204* (2013.01); *H01L 27/0296* (2013.01)

(58) Field of Classification Search
  CPC ............. H01L 27/1244; H01L 27/0296; G02F 1/136204
  USPC ............... 257/72, 59, 43, E29.147, E29.151; 349/110, 143, 145, 38, 39, 42, 43; 430/313, 316, 320; 438/104
  See application file for complete search history.

(56) References Cited

U.S. PATENT DOCUMENTS

| | | | |
|---|---|---|---|
| 6,243,146 B1* | 6/2001 | Rho | G02F 1/133345 349/42 |
| 6,654,073 B1* | 11/2003 | Maruyama | G02F 1/136213 349/138 |
| 8,259,244 B2* | 9/2012 | Kim | G02F 1/136209 349/106 |
| 2007/0178413 A1* | 8/2007 | Choi | H01L 27/1288 430/316 |

FOREIGN PATENT DOCUMENTS

| | | |
|---|---|---|
| CN | 103021940 A | 4/2013 |
| CN | 206178741 U | 5/2017 |

* cited by examiner

*Primary Examiner* — Dao H Nguyen
(74) *Attorney, Agent, or Firm* — McDermott Will & Emery LLP

(57) ABSTRACT

An array substrate and a display device are provided in the embodiments of the disclosure. The array substrate includes: a substrate; thin film transistors formed on the substrate, each of the thin film transistors comprising a gate electrode, a gate insulation layer, an active layer; and a source electrode and a drain electrode; a protective layer formed on the thin film transistors, having through-holes formed therein; and lead-out electrodes; and at least one support is provided below the through-holes, each of the through-holes being configured to form an electrical connection between the drain electrode in each of the thin film transistors and a corresponding one of the lead-out electrodes, an orthogonal projection of each of the through-holes on the substrate falling within an orthogonal projection of the at least one support on the substrate.

17 Claims, 3 Drawing Sheets

ARRAY SUBSTRATE AND DISPLAY DEVICE

CROSS-REFERENCE TO RELATED APPLICATION

The present disclosure claims the benefit of Chinese Patent Application Disclosure No. 201721047203.1 filed on Aug. 21, 2017 in the State Intellectual Property Office of China, the whole disclosure of which is incorporated herein by reference.

TECHNICAL FIELD

The present disclosure relates relate to the technical field of display, and especially to an array substrate and a display device.

BACKGROUND

In an active matrix driving-type display device, pixels are usually driven by means of thin film transistors (TFTs). Therefore, in the active matrix driving-type display device, a large number of TFTs need to be fabricated.

In relevant art, there is typically a passivation layer or a protective layer (e.g., an organic resin layer) provided to surrounding between a lead-out electrode and a drain-electrode of a thin film transistor (simplified as TFT) in an array substrate, and the lead-out electrode and the drain-electrode may for example be connected with each other via a through-hole formed in the passivation layer or the protective layer.

SUMMARY

The embodiments of the present disclosure have been made to overcome or alleviate at least one aspect of the above mentioned disadvantages and/or shortcomings in the prior art, by providing an array substrate and a display device.

Following technical solutions are adopted in exemplary embodiments of the disclosure for achieving the above desired technical purposes.

According to an aspect of the exemplary embodiment of the present disclosure, there is provided an array substrate, comprising: a substrate; thin film transistors formed on the substrate, each of the thin film transistors comprising a gate electrode, a gate insulation layer, an active layer; and a source electrode and a drain electrode; a protective layer formed on the thin film transistors, having through-holes formed therein; and lead-out electrodes; and at least one support is provided below the through-holes, each of the through-holes being configured to form an electrical connection between the drain electrode in each of the thin film transistors and a corresponding one of the lead-out electrodes, an orthogonal projection of each of the through-holes on the substrate falling within an orthogonal projection of the at least one support on the substrate.

In an embodiment of the disclosure, the array substrate comprises a plurality of supports functioning as the at least one support, which are provided independently of one another and arranged in a same straight line in a direction in which gate lines extend.

In an embodiment of the disclosure, the array substrate comprises a plurality of supports functioning as the at least one support, which are provided independently of one another and arranged in a same straight line in a direction in which data lines extend and perpendicular to a direction in which gate lines extend.

In an embodiment of the disclosure, the plurality of supports are arranged in a same straight line in the direction in which gate lines extend and perpendicular to a direction in which data lines extend.

In an embodiment of the disclosure, each of the at least one support is formed by at least one of a material of the active layer, a metal material, and a transparent conductive material.

In an embodiment of the disclosure, each of the at least one support comprises a first supporting layer and a second supporting layer overlapping with each other; the first supporting layer is formed by one of a transparent conductive material and a metal material, and formed in a same layer as a common electrode alongside the thin film transistors; and the second supporting layer is formed by a material of the gate electrode of each of the thin film transistors, and formed in a same layer as the gate electrode of each of the thin film transistors.

In an embodiment of the disclosure, each of the at least one support comprises a first supporting layer and a second supporting layer overlapping with each other; the first supporting layer is formed by a material of the gate electrode of each of the thin film transistors, and formed in a same layer as the gate electrode of each of the thin film transistors; and the second supporting layer is formed by a transparent conductive material, and formed in a same layer as a common electrode alongside the thin film transistors.

In an embodiment of the disclosure, each of the at least one support comprises a first supporting layer and a second supporting layer overlapping with each other; the first supporting layer is formed by a material of the gate electrode of each of the thin film transistors, and formed in a same layer as the gate electrode of each of the thin film transistors; and the second supporting layer is formed by a material of the active layer, and formed in a same layer as the active layer.

In an embodiment of the disclosure, each of the at least one support further comprises a third supporting layer; and the third supporting layer is formed by a material of the active layer and formed in a same layer as the active layer.

In an embodiment of the disclosure, the third supporting layer is formed integrally with the active layer.

In an embodiment of the disclosure, an area of an orthogonal projection of the first supporting layer on the substrate is larger than an area of an orthogonal projection of the through-holes on the substrate, and an area of an orthogonal projection of the first supporting layer on the substrate is larger than an area of an orthogonal projection of the second supporting layer on the substrate.

In an embodiment of the disclosure, a rigidity of the first supporting layer is larger than a rigidity of the second supporting layer.

In an embodiment of the disclosure, each of the lead-out electrodes which is led outwards from a corresponding one of the thin film transistors is connected with one type of each of pixel electrodes and another one of the thin film transistors of the array substrate.

In an embodiment of the disclosure, a thickness of the protective layer at a position of each of the through-holes is smaller than a thickness of the protective layer at a position of a corresponding source electrode.

According to another aspect of the exemplary embodiment of the present disclosure, there is provided a display device comprising: a display panel, comprising the array substrate as above; and a housing, configured to receive the display panel.

It is understood that other embodiments and configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION

Figure 1:
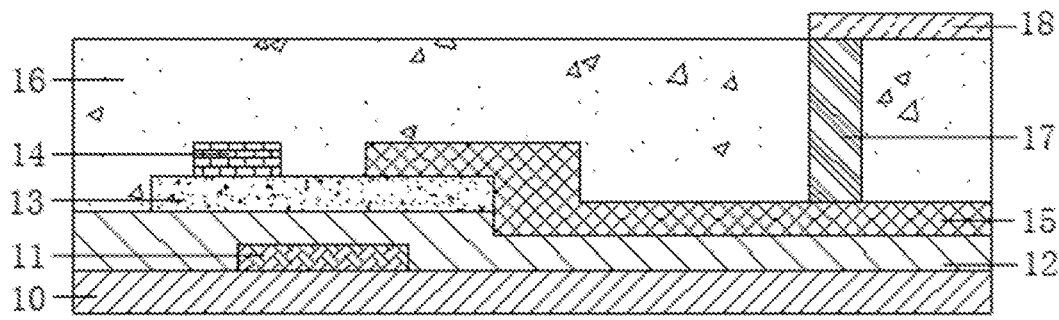
FIG. 1 illustrates a structural schematic view of an array substrate in relevant art.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of an array substrate and a display device.

As illustrated in FIG. 1, when a drain electrode 15 is connected with a lead-out electrode 18, a through-hole 17 is typically provided between the drain electrode 15 and the lead-out electrode 18 so as to implement an electrical connection therebetween.

However, upon contemplating embodiments of the disclosure, it is found that in relevant art, in order to protect effectively a circuit configuration of an array substrate, a thickness of a passivation layer or a protective layer 16 is typically provided to be larger as compared with a size (e.g., thickness) of the drain electrode or the lead-out electrode, resulting in a relatively large depth of the through-hole 17.

Figure 2:
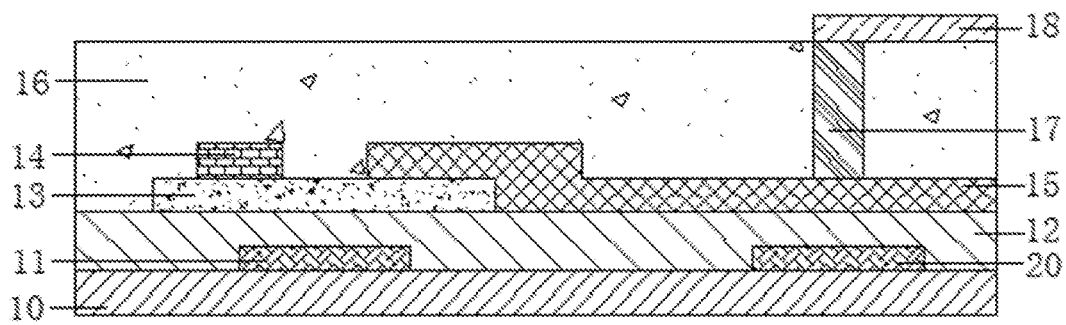
FIG. 2 illustrates a structural schematic view of an embodiment of an array substrate according to an embodiment of the disclosure.

According to a general technical concept of embodiments of the present disclosure, as illustrated in FIG. 1, in a first aspect of the embodiments of the disclosure, there is provided an exemplary array substrate. FIG. 2 illustrates a structural schematic view of an embodiment of an array substrate according to an embodiment of the disclosure. For example, as illustrated in FIG. 2, the array substrate comprises a substrate 10, thin film transistors (abbreviated as TFT hereinafter, only one TFT being illustrated as an example), a protective layer 16 and lead-out electrode(s) 18, all being provided to overlap with one another from the bottom up, with respective through-hole(s) 17 being formed within and through the protective layer 16; and each TFT comprises a gate electrode 11; a gate insulation layer 12, an active layer 13, and a source electrode 14 and a drain electrode 15. And at least one support 20 is provided below and in alignment with the respective through-hole 17 which through-hole forms an electrical connection between the drain electrode 15 and the respective lead-out electrode 18.

As seen from above embodiment, as to the array substrate as provided in the embodiment of the disclosure as illustrated in FIG. 2, since the at least one support is provided below and in alignment with the respective through-hole which through-hole forms an electrical connection between the drain electrode of each TFT and the respective lead-out electrode, then, in processes for forming structures of various layers on the substrate upwards therefrom, the drain electrode and the respective through-hole are formed above such additional support after the additional support is formed relatively proximate to the substrate. As a result, the drain electrode, and a bottom portion of the respective through-hole may be elevated/uplifted due to existence of the additional support thereat, especially due to a decrease in thickness of the protective layer at a corresponding position of the respective through-hole; however, the source electrode provided to be spaced apart from the drain electrode fails to be elevated/uplifted due to absence of any additional support therebelow, then a thickness of the protective layer at a corresponding position of the source electrode remains unchanged, such that the thickness of the protective layer at the corresponding position of the respective through-hole 17 is smaller than an overall thickness of the protective layer at the corresponding position of the source electrode 14 arranged to be spaced apart from the drain electrode 15. As such, a step mismatch/offset at the corresponding position of the respective through-hole communicating between the drain electrode and the respective lead-out electrode may be decreased, resulting in a decrease in a probability of opening/breakoff of electrode and an improvement in product yield.

In an embodiment of the disclosure, the at least one support may be applied to a corresponding position of a respective through-hole for a lead-out electrode of any TFT in the array substrate. By way of example, it may be applied to a design of an array substrate of a GOA (Gate driver on Array) structure, so as to increase the product yield of the GOA array substrate significantly.

Figure 4:
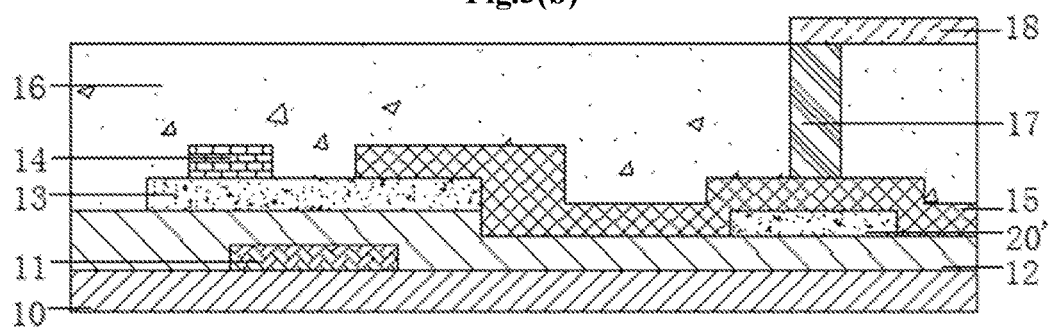
FIG. 4 illustrates a structural schematic view of another embodiment of an array substrate according to an embodiment of the disclosure.

In an embodiment of the disclosure, a material for manufacturing/preparing the at least one support 20, e.g., may be one material or more material chosen from a material of the gate electrode 11, a material of the active layer 13, a metal material, and a transparent conductive material. In an embodiment of the disclosure, the material of the gate electrode 11 may for example be a single-layered metal membrane formed by a metal material, such as Al, Cu, Mo, Ti, AlNd, or the like; or alternatively a multi-layered metal membrane formed by a combination of metal materials such as Mo/Al/Mo, or Ti/Al/Ti, etc. The active layer 13 may for example be an amorphous-silicon (e.g., a-Si) structure, a low temperature poly-silicon (e.g., LTPS) structure, a metallic oxide (e.g., IGZO) structure, or an organic polymer structure (e.g., Organic). The transparent conductive material may for example be a single-layered oxide conductive membrane, such as ITO (i.e., Indium Tin Oxide), IZO (i.e., Indium Zinc Oxide), or the like; or alternatively may for example be a composite/laminated membrane such as ITO/Ag/ITO, or IZO/Ag, etc. And the metal material may be the same as or different from the metal material of gate electrode or source/drain electrode, i.e., it may for example be a single-layered metal membrane formed by a metal material, such as Al, Cu, Mo, Ti, AlNd, or the like; or alternatively a multi-layered metal membrane formed by a combination of metal materials such as Mo/Al/Mo, or Ti/Al/Ti, etc. As such, the support 20 may for example be formed individually, or alternatively be formed synchronously with structures of other layers. In a condition that the material of the gate electrode 11 is selected to manufacture the support 20, e.g., the support 20 may be manufactured as a finished product at the same time when the gate electrode 11 is manufactured (referring to FIG. 2 for details); similarly, in a condition that the material of the active layer 13 is selected to manufacture the support 20', e.g., the support 20' may be manufactured as a finished product at the same time when the active layer 13 is manufactured (referring to FIG. 4 for details); and in a condition that the metal material or the transparent conductive material is selected to manufacture the support 20, e.g., the support 20 may be manufactured as a finished product at the same time when a common electrode is manufactured or pixel electrodes are manufactured (referring to FIG. 4 for details). Therefore, due to the specific process in which the support and the structures of other layers are formed synchronously, then, at the same time when the support is manufactured as a finished product, manufacturing processes may be saved/reduced accordingly, and the production efficiency may also be enhanced.

Figure 3A:
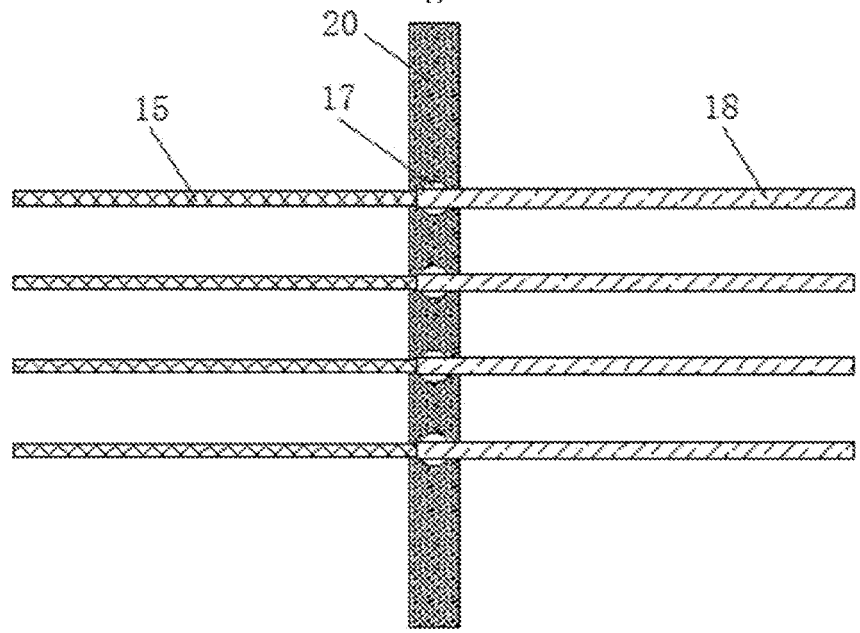
FIG. 3a illustrates a structural schematic top view of a plurality of supports in an embodiment of the array substrate as provided in the embodiment of the disclosure, in a condition that the plurality of supports are formed integrally, at positions of through-holes to which the plurality of supports are provided.

In an embodiment of the disclosure, as illustrated in FIG. 3(a), the array substrate comprises a plurality of supports 20 functioning as at least one support as above, and are interconnected with one another so as to be formed integrally, i.e., into an integrated piece. And the plurality of supports are arranged in a direction perpendicular to a direction in which data lines (which are connected with respective drain electrodes 15) extend, such that a bottom position of the respective through-hole for each of the data lines may be elevated/uplifted so as to decrease the depth of the respective through-hole.

Figure 3B:
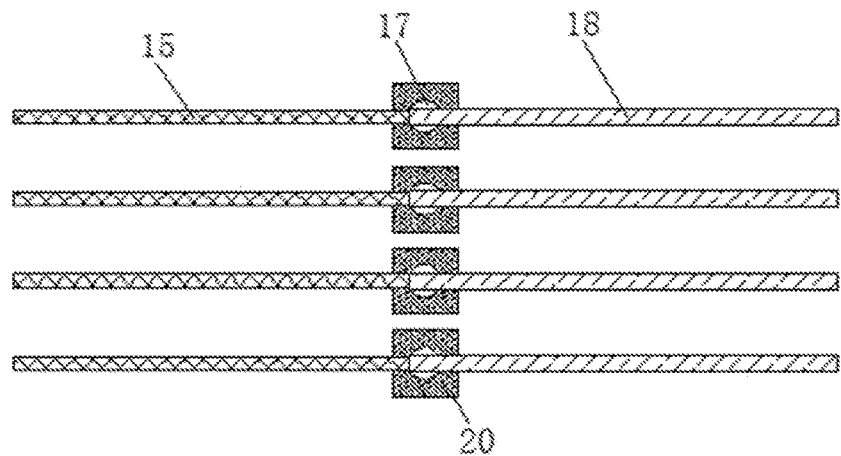
FIG. 3b illustrates a structural schematic top view of a plurality of supports in an embodiment of the array substrate as provided in the embodiment of the disclosure, in a condition that the plurality of supports are provided independently of one another, at positions of through-holes to which the plurality of supports are provided.

In an embodiment of the disclosure, as illustrated in FIG. 3(b), the array substrate comprises a plurality of supports 20 functioning as at least one support as above, and are provided independently of one another. And the plurality of supports may be arranged in a same straight line in a direction in which gate lines extend (i.e., perpendicular to the direction in which data lines extend), such that the plurality of supports 20 may be configured to elevate/uplift respective drain electrodes in the direction in which the gate lines extend so as to decrease the depth of the respective through-hole at corresponding positions thereat. In an embodiment of the disclosure, the plurality of supports may also for example be arranged in a same straight line in the direction in which data lines extend, such that the plurality of supports 20 may be configured to elevate/uplift respective drain electrodes in the direction in which the data lines extend so as to decrease the depth of the respective through-hole at corresponding positions thereat.

In an embodiment of the disclosure, each of the TFTs of the array substrate comprises a plurality of drain electrode sub-parts of comb-shaped and corresponding source electrode sub-parts of comb-shaped.

In an embodiment of the disclosure, each of the lead-out electrodes 18 is connected with the respective pixel electrode in a pixel region of the array substrate; or alternatively, each of the lead-out electrodes 18 which is led outwards from a corresponding one of the TFTs is connected with another one of the TFTs of the array substrate, in an electrostatic discharge (ESD) protection circuit, or a Gate driver on Array (GOA) region.

In an embodiment of the disclosure, a thickness of the protective layer 16 at a position of each of the through-holes 17 is smaller than a thickness of the protective layer 16 at a position of a corresponding source electrode 14.

Figure 5:
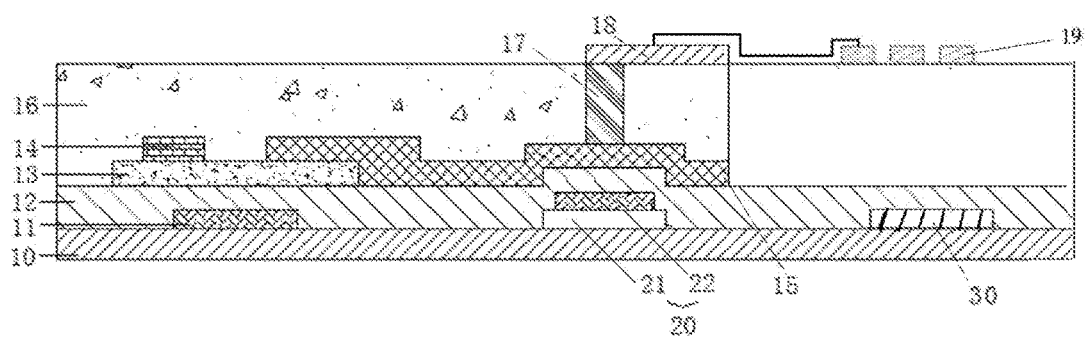
FIG. 5 illustrates a structural schematic view of still another embodiment of an array substrate according to an embodiment of the disclosure.

There is provided still another embodiment of the array substrate of the disclosure, in which a problem of relatively deep through-hole(s) may be alleviated, mitigated or overcome. FIG. 5 illustrates a structural schematic view of still another embodiment of an array substrate according to an embodiment of the disclosure.

The array substrate comprises a substrate 10, thin film transistors (abbreviated as TFT hereinafter, only one TFT being illustrated as an example), a protective layer 16 and lead-out electrode(s) 18, all being provided to overlap with one another from the bottom up, with respective through-hole(s) 17 being formed within and through the protective layer 16; and each TFT comprises a gate electrode 11; a gate insulation layer 12, an active layer 13, and a source electrode 14 and a drain electrode 15. And at least one support 20 is provided below and in alignment with the respective through-hole 17 which through-hole forms an electrical connection between the drain electrode 15 and the respective lead-out electrode 18; moreover, by way of example, an orthogonal projection of the through-hole 17 which connects the drain electrode 15 and the respective lead-out electrode 18 on the substrate 10, is located within an orthogonal projection of a corresponding one of the at least one support 20 on the substrate 10, such that the drain electrode and (a bottom of) the respective through-hole 17 thereabove are elevated/uplifted wholly/integrally across the at least one support 20.

The at least one support 20 is for example constructed to be a laminated structure, comprising a first supporting layer 21 and a second supporting layer 22 overlapping with each other.

By way of example, the first supporting layer 21 is formed by the transparent conductive material or the metal material, and the second supporting layer 22 is formed by the material of the gate electrode 11; the first supporting layer 21 is formed in a same layer as (i.e., manufactured with a same process as) a common electrode 30 alongside the respective TFT, and the second supporting layer 22 is formed in a same layer as (i.e., manufactured with a same process as) the gate electrode 11 alongside the respective TFT. As such, the common electrode is manufactured at the same time when the first supporting layer 21 may for example be manufactured to be a finished product, such that manufacturing processes may be saved/reduced accordingly, and the production efficiency may also be enhanced; similarly, the gate electrode 11 is manufactured at the same time when the second supporting layer 22 may for example be manufactured to be a finished product, such that manufacturing processes may be saved/reduced accordingly, and the production efficiency may also be enhanced.

As seen from above embodiment, as to the array substrate as provided in the embodiment of the disclosure, the at least one support is provided below and in alignment with the respective through-hole which through-hole forms an electrical connection between the drain electrode of each TFT and the respective lead-out electrode, such that the thickness of the protective layer at the corresponding position of the respective through-hole is smaller than an overall thickness of the protective layer at the corresponding position of the source electrode arranged to be spaced apart from the drain electrode. As such, a step mismatch/offset at the corresponding position of the respective through-hole communicating between the drain electrode and the respective lead-out electrode may be decreased, resulting in a decrease in a probability of opening/breakoff of electrode and an improvement in product yield; furthermore, since the at least one support is of the laminated structure, then a height of the drain may further be elevated so as to further decrease the depth of the respective through-hole, facilitating enhancement in product yield.

In an embodiment of the disclosure, each of the at least one support comprises the first supporting layer 21 which is formed in the same layer as the common electrode 30 and the second supporting layer 22 which is formed in the same layer as the gate electrode 11. For example, a thickness of the common electrode is about 0.1 µm, and a thickness of the gate electrode 11 is about 0.4 µm; correspondingly, a thickness of the first supporting layer 21 is about 0.1 µm, and the thickness of the second supporting layer 22 is about 0.4 µm. As such, the depth of the respective through-hole 17 is decreased by about ⅕~¼, so as to decrease effectively a risk in opening/breakoff there.

In an embodiment of the disclosure, the at least one support is adapted to be applied to corresponding position of a respective through-hole for a lead-out electrode of any TFT in the array substrate, especially to a design of an array substrate of a GOA (Gate driver on Array) structure, so as to increase the product yield of the GOA array substrate significantly.

In an embodiment of the disclosure, in addition to the at least one support 20 each of which is exemplarily provided with a laminated structure having two layers, depending on different practical requirements, the at least one support structure 20 of the laminated structure may further be provided with even more layers so as to meet various requirements of different through-hole depth. Therefore, the at least one support 20 of the laminated structure should not be restricted/limited to a scope of two layers.

In an embodiment of the disclosure, a rigidity of the first supporting layer 21 is larger than a rigidity of the second supporting layer 22, so as to ensure an integral bearing/supporting force and strength of the respective support 20.

In an embodiment of the disclosure, an area of an orthogonal projection of the first supporting layer 21 on the substrate is larger than an area of an orthogonal projection of the second supporting layer 22 on the substrate, such that a maximal coverage range across the respective support 20 may further be ensured so as to obtain an overall bearing/supporting force and strength and a stabilized performance or properties thereof.

In an embodiment of the disclosure, each of the TFTs of the array substrate comprises a plurality of drain electrode sub-parts of comb-shaped and corresponding source electrode sub-parts of comb-shaped.

In an embodiment of the disclosure, for example, as illustrated in FIG. 5, each of the lead-out electrodes 18 is connected with the respective pixel electrode 19 in a pixel region of the array substrate; or alternatively, for example, each of the lead-out electrodes 18 which is led outwards from a corresponding one of the TFTs is connected with another one of the TFTs of the array substrate, in an electrostatic discharge (ESD) protection circuit, or a Gate driver on Array (GOA) region.

In an embodiment of the disclosure, a thickness of the protective layer 16 at a position of each of the through-holes 17 is smaller than a thickness of the protective layer 16 at a position of a corresponding source electrode 14, such that a problem of the respective through-hole which is excessively deep and thus readily causes opening/breakoff there may be alleviated, mitigated or overcome.

In addition to above embodiments, in some other embodiments, the first supporting layer may also be formed by the material of the gate electrode and formed in the same layer as the gate electrode 11, while the second supporting layer may also be formed by the material of the active layer and formed in the same layer as the active layer 13; as such, the gate electrode 11 is manufactured at the same time when the first supporting layer may for example be manufactured to be a finished product, and the active layer 13 is manufactured at the same time when the second supporting layer may for example be manufactured to be a finished product, such that manufacturing processes may be saved/reduced accordingly, and the production efficiency may also be enhanced.

In some other embodiments, in a condition that the first supporting layer is formed by the material of the gate electrode and formed in the same layer as the gate electrode, then the second supporting layer may also be formed by the transparent conductive material and formed in the same layer as the common electrode; as such, in a condition that specific sequences/orders of steps for manufacturing the gate electrode and the common electrodes respectively are reversed, then, upon manufacturing the at least one support, it may be ensured that one support and a corresponding one gate electrode or common electrode may be formed in a same layer, so as to save manufacturing processes.

Figure 6:
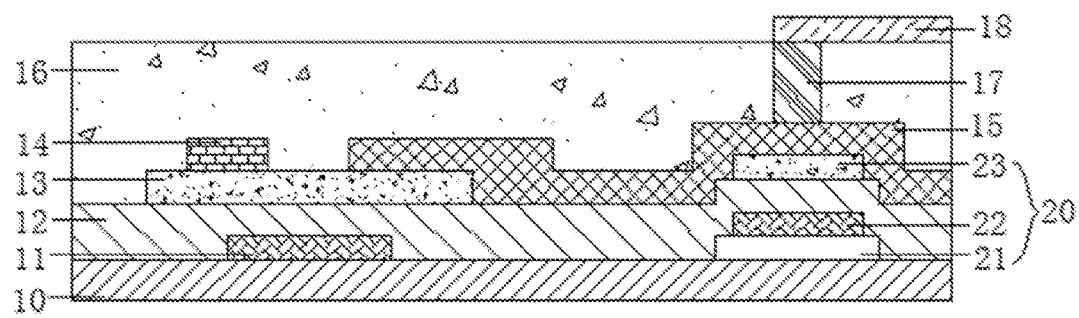
FIG. 6 illustrates a structural schematic view of yet another embodiment of an array substrate according to an embodiment of the disclosure.

There is further provided yet another embodiment of the array substrate of the disclosure, in which a problem of relatively deep through-hole(s) may be alleviated, mitigated or overcome. FIG. 6 illustrates a structural schematic view of yet another embodiment of an array substrate according to an embodiment of the disclosure.

The array substrate comprises a substrate 10, thin film transistors (abbreviated as TFT hereinafter, only one TFT being illustrated as an example), a protective layer 16 and lead-out electrode(s) 18, all being provided to overlap with one another from the bottom up, with respective through-hole(s) 17 being formed within and through the protective layer 16; and each TFT comprises a gate electrode 11; a gate insulation layer 12, an active layer 13, and a source electrode 14 and a drain electrode 15. And at least one support 20 is provided below and in alignment with the respective through-hole 17 which through-hole forms an electrical connection between the drain electrode 15 and the respective lead-out electrode 18; moreover, by way of example, an orthogonal projection of the through-hole 17 which connects the drain electrode 15 and the respective lead-out electrode 18 on the substrate 10, is located within an orthogonal projection of a corresponding one of the at least one support 20 on the substrate 10, such that the drain electrode and (a bottom of) the respective through-hole 17 thereabove are elevated/uplifted wholly/integrally across the at least one support 20.

The at least one support 20 for example comprises a first supporting layer 21 and a second supporting layer 22, and a third supporting layer 23 overlapping with one another.

By way of example, the first supporting layer 21 is formed by the transparent conductive material or the metal material, the second supporting layer 22 is formed by the material of the gate electrode 11, and the third supporting layer 23 is formed by the material of the active layer 13; the first supporting layer 21 is formed in a same layer as (i.e., manufactured with a same process as) a common electrode 30 alongside the respective TFT or respective pixel electrode (s), and the second supporting layer 22 is formed in a same layer as (i.e., manufactured with a same process as) the gate electrode 11 alongside the respective TFT, and the third supporting layer 23 is formed in a same layer as (i.e., manufactured with a same process as) the active layer 13. As such, the common electrode or respective pixel electrode(s) may be manufactured at the same time when the first supporting layer 21 may for example be manufactured to be a finished product, such that manufacturing processes may be saved/reduced accordingly, and the production efficiency may also be enhanced; similarly, the gate electrode 11 is manufactured at the same time when the second supporting layer 22 may for example be manufactured to be a finished product, such that manufacturing processes may be saved/reduced accordingly, and the production efficiency may also be enhanced; and similarly, the active layer 13 is manufactured at the same time when the third supporting layer 23 may for example be manufactured to be a finished product, such that manufacturing processes may be saved/reduced accordingly, and the production efficiency may also be enhanced.

As seen from above embodiment, as to the array substrate as provided in the embodiment of the disclosure as illustrated in FIG. 6, since the at least one support is provided below and in alignment with the respective through-hole which through-hole forms an electrical connection between the drain electrode of each TFT and the respective lead-out electrode, then, in processes for forming structures of various layers on the substrate upwards therefrom, the drain electrode and the respective through-hole are formed above such additional support after the additional support is formed relatively proximate to the substrate. As a result, the drain electrode, and a bottom portion of the respective through-hole may be elevated/uplifted due to existence of the additional support thereat, especially due to a decrease in thickness of the protective layer at a corresponding position of the respective through-hole; however, the source electrode provided to be spaced apart from the drain electrode fails to be elevated/uplifted due to absence of any additional support therebelow, then a thickness of the protective layer at a corresponding position of the source electrode remains unchanged, such that the thickness of the protective layer at the corresponding position of the respective through-hole 17 is smaller than an overall thickness of the protective layer at the corresponding position of the source electrode 14 arranged to be spaced apart from the drain electrode 15. As such, a step mismatch/offset at the corresponding position of the respective through-hole communicating between the drain electrode and the respective lead-out electrode may be decreased, resulting in a decrease in a probability of opening/breakoff of electrode and an improvement in product yield; furthermore, since the at least one support is of the laminated structure and there is further added the third supporting layer, then a height of the drain may further be elevated so as to further decrease the depth of the respective through-hole, facilitating enhancement in product yield.

In an embodiment of the disclosure, each of the at least one support comprises the first supporting layer 21 which is formed in the same layer as the common electrode, the second supporting layer 22 which is formed in the same layer as the gate electrode 11, and the third supporting layer 23 which is formed in the same layer as the active layer 13. For example, a thickness of the common electrode is about 0.1 µm, a thickness of the gate electrode 11 is about 0.4 µm, and a thickness of the active layer 13 is about 0.3 µm; correspondingly, a thickness of the first supporting layer 21 is about 0.1 µm, the thickness of the second supporting layer 22 is about 0.4 µm, and the thickness of the third supporting layer 23 is about 0.3 µm. As such, the depth of the respective through-hole 17 is decreased by about ¼~⅓, so as to decrease effectively a risk in opening/breakoff there.

In an embodiment of the disclosure, an area of an orthogonal projection of the first supporting layer 21 on the substrate 10 is larger than an area of an orthogonal projection of the second supporting layer 22 on the substrate 10, and an area of an orthogonal projection of the second supporting layer 22 on the substrate 10 is larger than an area of an orthogonal projection of the third supporting layer 23 on the substrate 10, such that a maximal coverage range across the respective support 20 may further be ensured so as to obtain an overall bearing/supporting force and strength and a stabilized performance or properties thereof.

Figure 7:
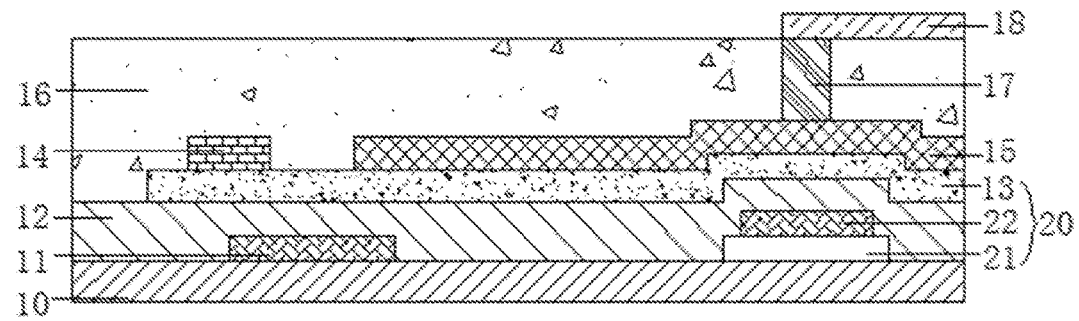
FIG. 7 illustrates a structural schematic view of still yet another embodiment of an array substrate according to an embodiment of the disclosure.

There is provided still yet another embodiment of the array substrate of the disclosure, in which a problem of relatively deep through-hole(s) may be alleviated, mitigated or overcome. FIG. 7 illustrates a structural schematic view of still yet another embodiment of an array substrate according to an embodiment of the disclosure.

The array substrate comprises a substrate 10, thin film transistors (abbreviated as TFT hereinafter, only one TFT being illustrated as an example), a protective layer 16 and lead-out electrode(s) 18, all being provided to overlap with one another from the bottom up, with respective through-hole(s) 17 being formed within and through the protective layer 16; and each TFT comprises a gate electrode 11; a gate insulation layer 12, an active layer 13, and a source electrode 14 and a drain electrode 15. And at least one support 20 is provided below and in alignment with the respective through-hole 17 which through-hole forms an electrical connection between the drain electrode 15 and the respective lead-out electrode 18; moreover, by way of example, an orthogonal projection of the through-hole 17 which connects the drain electrode 15 and the respective lead-out electrode 18 on the substrate 10, is located within an orthogonal projection of a corresponding one of the at least one support 20 on the substrate 10, such that the drain electrode and (a bottom of) the respective through-hole 17 thereabove are elevated/uplifted wholly/integrally across the at least one support 20.

The at least one support 20 is for example constructed to be a laminated structure, comprising a first supporting layer 21 and a second supporting layer 22, and a third supporting layer overlapping with one another.

By way of example, the first supporting layer 21 is formed by the transparent conductive material or the metal material, the second supporting layer 22 is formed by the material of the gate electrode 11, and the third supporting layer is formed by the material of the active layer 13; the first supporting layer 21 is formed in a same layer as (i.e., manufactured with a same process as) a common electrode 30 alongside the respective TFT, and the second supporting layer 22 is formed in a same layer as (i.e., manufactured with a same process as) the gate electrode 11 alongside the respective TFT, and the third supporting layer is formed in a same layer as (i.e., manufactured with a same process as) the active layer 13. As such, the common electrode or respective pixel electrode(s) may be manufactured at the same time when the first supporting layer 21 may for example be manufactured to be a finished product, such that manufacturing processes may be saved/reduced accordingly, and the production efficiency may also be enhanced; similarly, the gate electrode 11 is manufactured at the same time when the second supporting layer 22 may for example be manufactured to be a finished product, such that manufacturing processes may be saved/reduced accordingly, and the production efficiency may also be enhanced; and similarly, the active layer 13 is manufactured at the same time when the third supporting layer 23 may for example be manufactured to be a finished product, such that manufacturing processes may be saved/reduced accordingly, and the production efficiency may also be enhanced.

As seen from above embodiment, as to the array substrate as provided in the embodiment of the disclosure, the at least one support is provided below and in alignment with the respective through-hole which through-hole forms an electrical connection between the drain electrode of each TFT and the respective lead-out electrode, such that the thickness of the protective layer at the corresponding position of the respective through-hole is smaller than an overall thickness of the protective layer at the corresponding position of the source electrode arranged to be spaced apart from the drain electrode. As such, a step mismatch/offset at the corresponding position of the respective through-hole communicating between the drain electrode and the respective lead-out electrode may be decreased, resulting in a decrease in a probability of opening/breakoff of electrode and an improvement in product yield; furthermore, since the at least one support is of the laminated structure, then a height of the drain may further be elevated so as to further decrease the depth of the respective through-hole, facilitating enhancement in product yield; furthermore, since the at least one support is of the laminated structure and there is further added the third supporting layer, then a height of the drain may further be elevated so as to further decrease the depth of the respective through-hole, facilitating enhancement in product yield; and moreover, the third supporting layer is directly formed integrally with the active layer so as to further save/decrease processes.

It should be noted that, above embodiments are not only adapted to conditions in which the TFTs are located at a surrounding area of the array substrate, but also adapted to conditions in which the TFTs are located within the ESD (i.e., Electro-Static Discharge) region or pixel regions. For example, the gate layer may be the gate line(s) of respective pixel unit(s), the source electrode may be connected with respective one of data lines, and the respective lead-out electrode may be connected with the respective pixel unit(s). In above exemplary embodiments, a bottom-gate type TFT is taken for example; and it should be known that, based on an identical inventive concept, these embodiments may also be adapted to a top-gate type TFT.

In a second aspect of the embodiments of the disclosure, there is provided an embodiment of a display device of the disclosure, in which a problem of relatively deep through-hole(s) may be alleviated, mitigated or overcome. The display device comprises: a display panel which further comprises the array substrate according to any one of the embodiments as above; and a housing configured to receive the display panel.

It should be noted that, the display device in the embodiment of the disclosure may for example be any products or components having a display function such as an electronic paper product, a mobile phone, a tablet computer, a television set, a laptop computer, a digital photo frame, a navigator, etc.

As seen from above embodiment, as to the display device as provided in the embodiment of the disclosure, the at least one support is provided below and in alignment with the respective through-hole which through-hole forms an electrical connection between the drain electrode of each TFT and the respective lead-out electrode, such that the thickness of the protective layer at the corresponding position of the respective through-hole is smaller than an overall thickness of the protective layer at the corresponding position of the source electrode arranged to be spaced apart from the drain electrode. As such, a step mismatch/offset at the corresponding position of the respective through-hole communicating between the drain electrode and the respective lead-out electrode may be decreased, resulting in a decrease in a probability of opening/breakoff of electrode and an improvement in product yield.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An array substrate, comprising:
a substrate;
thin film transistors formed on the substrate, each of the thin film transistors comprising:
a gate electrode;
a gate insulation layer;
an active layer; and
a source electrode and a drain electrode,
a protective layer formed on the thin film transistors, having through-holes formed therein; and
lead-out electrodes,
wherein the array substrate further comprises at least one support all of which is provided immediately below the through-holes, each of the through-holes being configured to form an electrical connection between the drain electrode in each of the thin film transistors and a corresponding one of the lead-out electrodes, an orthogonal projection of each of the through-holes on the substrate falling within an orthogonal projection of the at least one support on the substrate, and
wherein the array substrate comprises a plurality of supports functioning as the at least one support, and the plurality of supports are: (i) interconnected with one another and formed integrally into one piece; or (ii) provided independently of one another,
when the plurality of supports are interconnected with one another and formed integrally into one piece, the plurality of supports are arranged in a direction perpendicular to a direction in which data lines extend, and an orthogonal projection of the plurality of supports on the substrate at least partially overlaps with an orthogonal projection of the data lines themselves extending in the direction in which data lines extend on the substrate; and
when the plurality of supports are provided independently of one another, the plurality of supports are arranged in one and the same straight line in a direction perpendicular to the direction in which data lines extend, and an orthogonal projection of the plurality of supports on the substrate at least partially overlaps with an orthogonal projection of the data lines themselves extending in the direction in which data lines extend.

2. The array substrate according to claim 1, wherein the plurality of supports are provided independently of one another and arranged in a same straight line in a direction in which gate lines extend.

3. The array substrate according to claim 1, wherein each of the at least one support is formed by at least one of a material of the active layer, a metal material, and a transparent conductive material.

4. The array substrate according to claim 1, wherein each of the at least one support comprises a first supporting layer and a second supporting layer overlapping with each other;
wherein the first supporting layer is formed by one of a transparent conductive material and a metal material, and formed in a same layer as a common electrode alongside the thin film transistors; and
wherein the second supporting layer is formed by a material of the gate electrode of each of the thin film transistors, and formed in a same layer as the gate electrode of each of the thin film transistors.

5. The array substrate according to claim 4, wherein each of the at least one support further comprises a third supporting layer; and
wherein the third supporting layer is formed by a material of the active layer and formed in a same layer as the active layer.

6. The array substrate according to claim 5, wherein the third supporting layer is formed integrally with the active layer.

7. The array substrate according to claim 4, wherein an area of an orthogonal projection of the first supporting layer on the substrate is larger than an area of an orthogonal projection of the through-holes on the substrate, and an area of an orthogonal projection of the first supporting layer on the substrate is larger than an area of an orthogonal projection of the second supporting layer on the substrate.

8. The array substrate according to claim 4, wherein a rigidity of the first supporting layer is larger than a rigidity of the second supporting layer.

9. The array substrate according to claim 1, wherein each of the at least one support comprises a first supporting layer and a second supporting layer overlapping with each other;
wherein the first supporting layer is formed by a material of the gate electrode of each of the thin film transistors, and formed in a same layer as the gate electrode of each of the thin film transistors; and
wherein the second supporting layer is formed by a transparent conductive material, and formed in a same layer as a common electrode alongside the thin film transistors.

10. The array substrate according to claim 9, wherein an area of an orthogonal projection of the first supporting layer on the substrate is larger than an area of an orthogonal projection of the through-holes on the substrate, and an area of an orthogonal projection of the first supporting layer on the substrate is larger than an area of an orthogonal projection of the second supporting layer on the substrate.

11. The array substrate according to claim 9, wherein a rigidity of the first supporting layer is larger than a rigidity of the second supporting layer.

12. The array substrate according to claim 1, wherein each of the at least one support comprises a first supporting layer and a second supporting layer overlapping with each other;
wherein the first supporting layer is formed by a material of the gate electrode of each of the thin film transistors, and formed in a same layer as the gate electrode of each of the thin film transistors; and
wherein the second supporting layer is formed by a material of the active layer, and formed in a same layer as the active layer.

13. The array substrate according to claim 12, wherein an area of an orthogonal projection of the first supporting layer on the substrate is larger than an area of an orthogonal projection of the through-holes on the substrate, and an area of an orthogonal projection of the first supporting layer on the substrate is larger than an area of an orthogonal projection of the second supporting layer on the substrate.

14. The array substrate according to claim 12, wherein a rigidity of the first supporting layer is larger than a rigidity of the second supporting layer.

15. The array substrate according to claim 1, wherein each of the lead-out electrodes which is led outwards from a corresponding one of the thin film transistors is connected with one type of each of pixel electrodes and another one of the thin film transistors of the array substrate.

16. The array substrate according to claim 1, wherein a thickness of the protective layer at a position of each of the through-holes is smaller than a thickness of the protective layer at a position of a corresponding source electrode.

17. A display device comprising:
   a display panel, comprising the array substrate according to claim 1; and
   a housing, configured to receive the display panel.

* * * * *